United States Patent [19]

Davis

[11] Patent Number: 5,006,730
[45] Date of Patent: Apr. 9, 1991

[54] BIMOS LOGIC GATES

[75] Inventor: Darrell E. Davis, Sunrise, Fla.

[73] Assignee: Motorola, Inc., Schaumburg, Ill.

[21] Appl. No.: 586,321

[22] Filed: Sep. 21, 1990

Related U.S. Application Data

[63] Continuation of Ser. No. 345,753, May 1, 1989, abandoned.

[51] Int. Cl.$^5$ .................. H03K 19/02; H03K 19/086; H03K 19/0175
[52] U.S. Cl. .................. 307/446; 307/448; 307/455; 307/475; 307/570
[58] Field of Search .............. 307/443, 446, 448, 455, 307/570, 475

[56] References Cited

U.S. PATENT DOCUMENTS

| | | | |
|---|---|---|---|
| 4,645,951 | 2/1987 | Uragami | 307/443 |
| 4,749,883 | 6/1988 | Price, Jr. | 307/475 |
| 4,804,868 | 2/1989 | Masuda et al. | 307/446 |
| 4,804,869 | 2/1989 | Masuda et al. | 307/446 |

*Primary Examiner*—Stanley D. Miller
*Assistant Examiner*—Margaret Rose Wambach
*Attorney, Agent, or Firm*—Pablo Meles; Thomas G. Berry

[57] ABSTRACT

A BIMOS logic gate (10) comprises a differential circuit having a common biasing network (14). A MOS transistor (16) in one portion of the differential circuit receives a MOS level input signal (36) and provides an ECL level output signal (34). A bipolar transistor (20) is biased by a complementary ECL level input signal 32'. The other portion of the differential circuit includes a bipolar transistor (30) that is biased by an ECL level input signal 32. The emitter coupled transistors 20 and 30, receiving complementary ECL level inputs, along with the MOS transistor 36, receiving MOS level inputs, combine to provide logic functions with ECL level outputs 34 and 34'.

42 Claims, 3 Drawing Sheets

BIMOS LOGIC GATES

This is a continuation of application Ser. No. 07/345,753, filed 05/01/89 and now abandoned.

TECHNICAL FIELD

This invention relates generally to BIMOS circuits, more particularly to BIMOS logic circuits suitable for integration.

BACKGROUND ART

Contemporary BIMOS integrated processes enable I.C. manufacturers to integrate bipolar devices and MOS devices on the same I.C. chip. Accordingly, I.C. designers must provide circuitry to interface these differing technology devices since they customarily operate using different power supplies or voltage sources I.C. designers are often frustrated in providing suitable interfacing circuitry because some MOS circuitry may operate using a single-ended signal, while emitter-coupled logic (ECL) bipolar circuitry often operates using complementary or differential signals.

Additional circuitry maybe needed to level shift from MOS level to ECL level inputs and outputs. Avoiding this additional circuitry can reduce current drain as well as chip size.

One solution may be to operate all devices using complementary signals. However, such practice complicates the MOS portion of the I.C. and may result in increased chip size to accommodate the additional runners required to form differential MOS circuitry. Accordingly, a need exists to provide BIMOS logical circuit gates capable of providing ECL compatible complementary signals that do not unnecessarily complicate the design of the I.C. or unduly increase chip size.

SUMMARY OF THE INVENTION

Accordingly, it is an object of the present invention to provide BIMOS circuits that overcome the detriments discussed above.

Briefly, according to the invention, a BIMOS logic circuit may comprise a differential circuit having a common biasing network. A MOS transistor or a MOS transistor pair in one portion of the differential circuit receives MOS level input signals and provides an ECL level output signal. These MOS transistors are also used as level current steering devices. Bipolar transistors in this portion of the differential circuit are biased by ECL level inputs.

Another portion of the differential circuit includes bipolar transistors that are biased by ECL level inputs complementary to the signals received in the first portion. One port of a bipolar transistor in this portion provides a complementary output signal. Other portions of the differential circuit comprises bipolar transistor which are biased by ECL level input signals. The bipolar transistor operates to process and provide a complementary ECL level output signal so as to provide a single ended MOS to differential ECL interface suitable for integration in an I.C.

DETAILED DESCRIPTION OF THE PREFERRED EMBODIMENT

Figure 1:
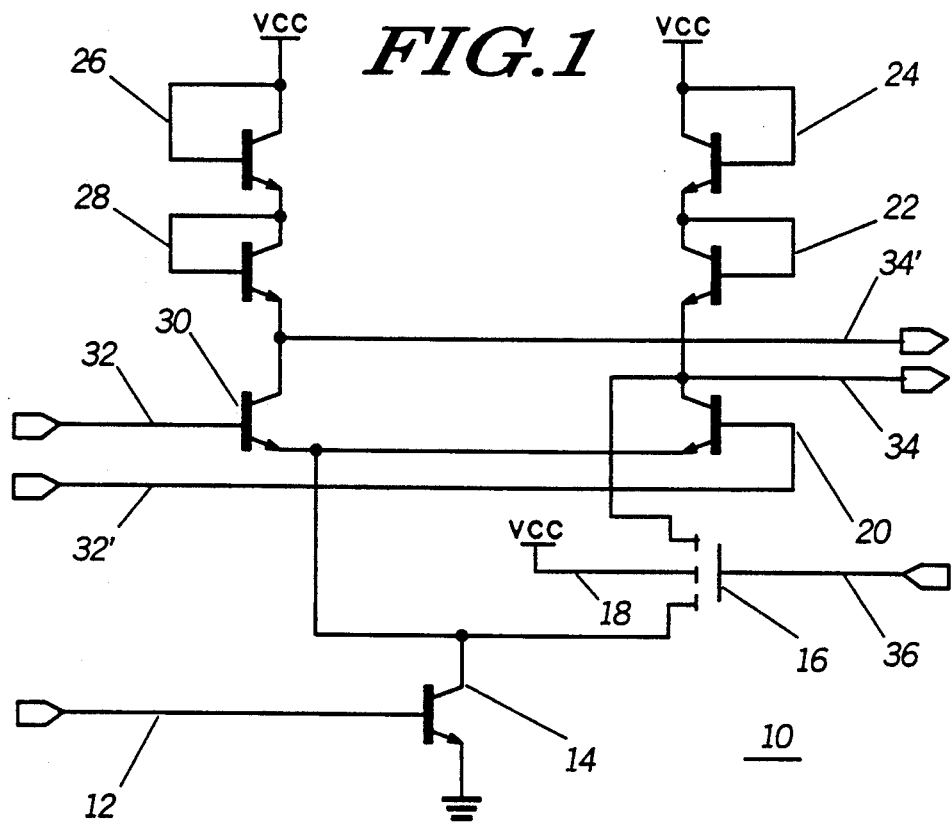
FIG. 1 is a schematic diagram of a BIMOS logic and/or gate in accordance with the present invention.

Referring to FIG. 1, there is shown a schematic diagram of a BIMOS logic circuit 10 in accordance with the present invention. Operationally, a bias current (12) is received by a biasing transistor 14, which provides a bias current for the BIMOS logic gate 10. Preferably, the biasing current of the present invention is 100μa, although biasing currents in the range of 10–400μa maybe used depending upon the speed at which the BIMOS logic gate 10 operates. A MOS transistor 16 is biased (18) to receive a MOS-level signal at an input 36. As used in conjunction with the present invention, MOS level signals are contemplated to be in a voltage range of 0.5–4.5 volts.

Assuming that the MOS transistor 16 is receiving a logic zero-level signal (i.e., approximately 0.5 volts), the MOS transistor 16 will enter a conductive state that draws current from a voltage source (Vcc) through two series diodes 22 and 24. With current flowing through the MOS transistor 16, the potential at a first output port 34 (the junction of transistor 16 and diode 22) will form a zero-level diode loaded ECL compatible signal that is logically equivalent to the input signal received by the MOS transistor 16. That is, once the MOS transistor 16 receives a MOS zero-level input signal, a logic zero-level ECL compatible differential output signal of approximately 200mv is provided at the output port 34. ECL compatible differential signals are readily provided by the BIMOS logic circuit 10 by providing ECL level logic signals to bipolar transistor 30 at input 32. If bipolar transistor 30 receives a logic one signal (approximately 5 volts), then current will conduct through diode leads 26 and 28, thereby providing an ECL level logic zero signal at output 34'. Conversely, if bipolar transistor 30 receives a logic zero signal (approximately 0.5 volts), then no current will flow through transistor 30, thereby causing output port 34' to reach an ECL level logic one signal. Bipolar transistor 20 receives a complementary ECL level signal at input 32'. Bipolar transistor 20 functions the same way as bipolar transistor 30 as long as MOS transistor stays nonconductive (i.e., receives a MOS level- one signal). When MOS transistor 16 is in a conductive state, current through bipolar transistor 20 is bypassed through MOS transistor 16, causing the output at 34 to stay low. In this way, complementary (differential) ECL compatible output signals are provided at outputs 34 and 34' in response to MOS-level signals received (36) by the MOS transistor 16.

Assuming that the MOS transistor 16 receives a logic one-level signal (i.e., approximately 4.5 volts), the MOS transistor 16 will enter a nonconductive state and causing the potential at the output port 34 to reach approximately Vcc if bipolar transistor 20 likewise enters a nonconductive state by receiving a ECL level logical zero input (32'). Again, ECL compatible differential output signals are readily provided by receiving a ECL level logical zero signal at input port 32, invoking a nonconductive state in bipolar transistor 30. This causes the output port 34' to reach a ECL logic level-one output signal. Preferably, the MOS transistor 16 comprises a P-channel device, which has the desirable property of displacing charge rapidly via parasitic capacitances between the gate and source of the MOS device. This results in an improved operational speed performance when the MOS transistor 16 moves from the conducting state to the nonconductive state.

The following is a truth table for BIMOS AND/OR logic gate 10:

| | | 32 AND 36 = 34 32' OR 36' = 34' | | | |
|---|---|---|---|---|---|
| (32) | (32') | (36) | (-) | (34) | (34') |
| 0 | 1 | 1 | 0 | 0 | 1 |
| 1 | 0 | 1 | 0 | 1 | 0 |
| 1 | 0 | X* | X | 0 | 1 |

*X indicates don't care states.

Figure 2:
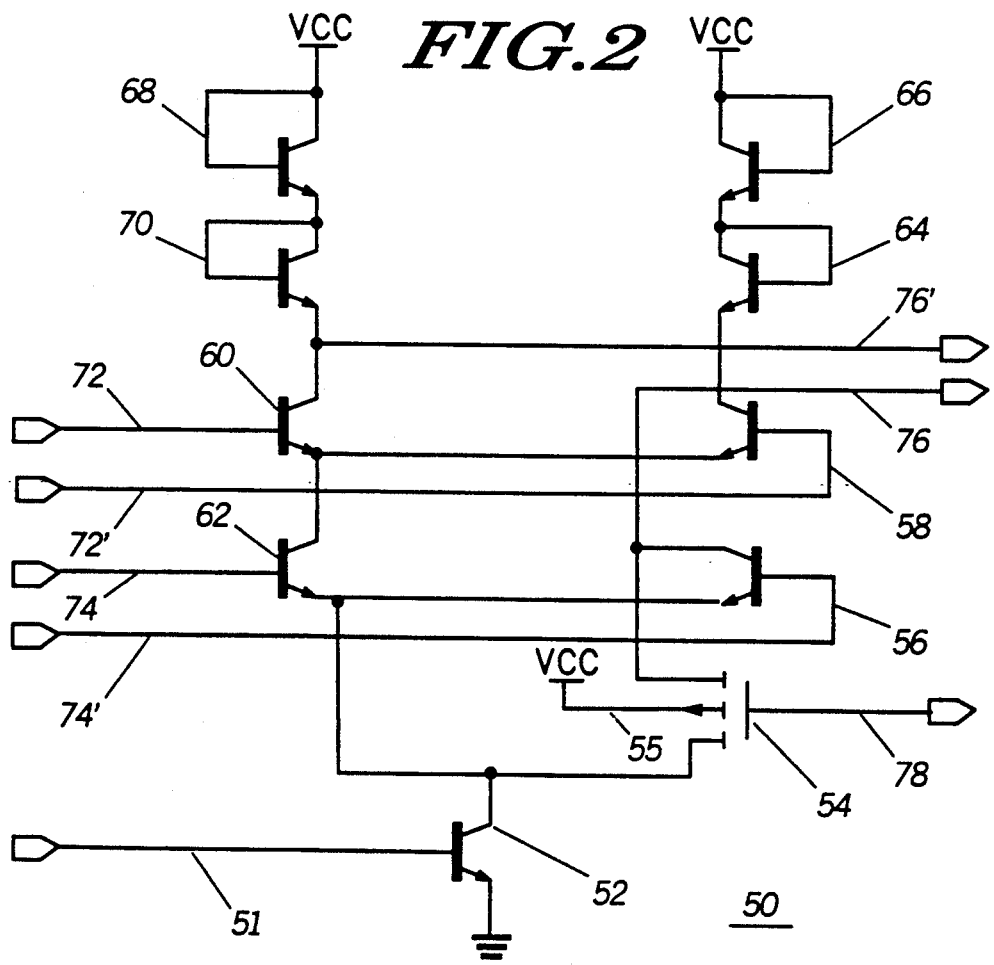
FIG. 2 is a schematic diagram of another BIMOS logic and/or gate in accordance with the present invention.

Referring to FIG. 2, there is shown a schematic diagram of a BIMOS logic circuit 50 in accordance with the present invention. Operationally and physically, BIMOS logic circuit 50 is substantially similar to BIMOS logic circuit 10 of FIG. 1. Physically, BIMOS logic circuit 50 has an additional transistor pair (56 and 62) allowing for additional inputs. As in BIMOS logic circuit 10, BIMOS logic circuit 50 has a bias current (51) received by biasing transistor 52.

Assuming that the MOS transistor 54 is receiving a logic zero level signal (i.e., approximately 0.5 volts) at its input 78, the MOS transistor will enter a conductive state that draws current from a voltage source (Vcc) through two diodes 64 and 66. With current flowing through the MOS transistor 54, the potential at a first output port 76 will form a logic zero diode loaded ECL compatible signal that is logically equivalent to the input signal received by the MOS transistor 54. That is, once the MOS transistor 54 receives a logic zero-level MOS input signal, a logic zero ECL compatible differential output signal of approximately 200 mv is provided at the output port 76. ECL compatible differential signals are readily provided by the BIMOS logic circuit 50 by providing an ECL level logic zero (approx 0.5 volts) or logic one (approximately 4.5 volts) to bipolar transistor 60 at input 72 and to bipolar transistor 62 at input 74. Output 76' provides an ECL logic level-one output when either or both transistors 60 and 62 receive a logic level-zero input. This causes 76' to reach Vcc. Only when both transistors 60 and 62 receive logic level-ones, thereby conducting current through diode loads 68 and 70, does the output 76' go low. In this way, complementary (differential) ECL compatible output signals are provided at outputs 76 and 76' in response to MOS-level signals received (78) by the MOS transistor 54.

Assuming that the MOS transistor 54 receives a logic level-one signal (i.e., approximately 4.5 volts), the MOS transistor 54 will enter a nonconductive state and causing the potential at the output port 76 to reach approximately Vcc if bipolar transisor 58 likewise enters a nonconductive state by receiving a ECL level-zero input (72'). Again, ECL compatible differential output signals are readily provided by receiving ECL level logical signals at input ports 72, 72', 74, and 74'.

Preferably, the MOS transistor 54 comprises a P-channel device, which has the desirable property of displacing charge rapidly via parasitic capacitances between the gate and source of the MOS device. This results in an improved operational speed performance when the MOS transistor 54 moves from the conducting state to the nonconductive state.

The following is a truth table for BIMOS AND/OR LOGIC circuit 50:

| | | 72 AND 74 = 76 72' OR 74' = 76' | | | | |
|---|---|---|---|---|---|---|
| (72) | (72') | (74) | (74') | (78) | (76) | (76') |
| 0 | 1 | 0 | 1 | 1 | 0 | 1 |
| 0 | 1 | 1 | 0 | 1 | 0 | 1 |
| 1 | 0 | 0 | 1 | 1 | 0 | 1 |
| 1 | 0 | 1 | 0 | 1 | 1 | 0 |
| X | X | X | X | 0 | 0 | 1 |

Figure 3:
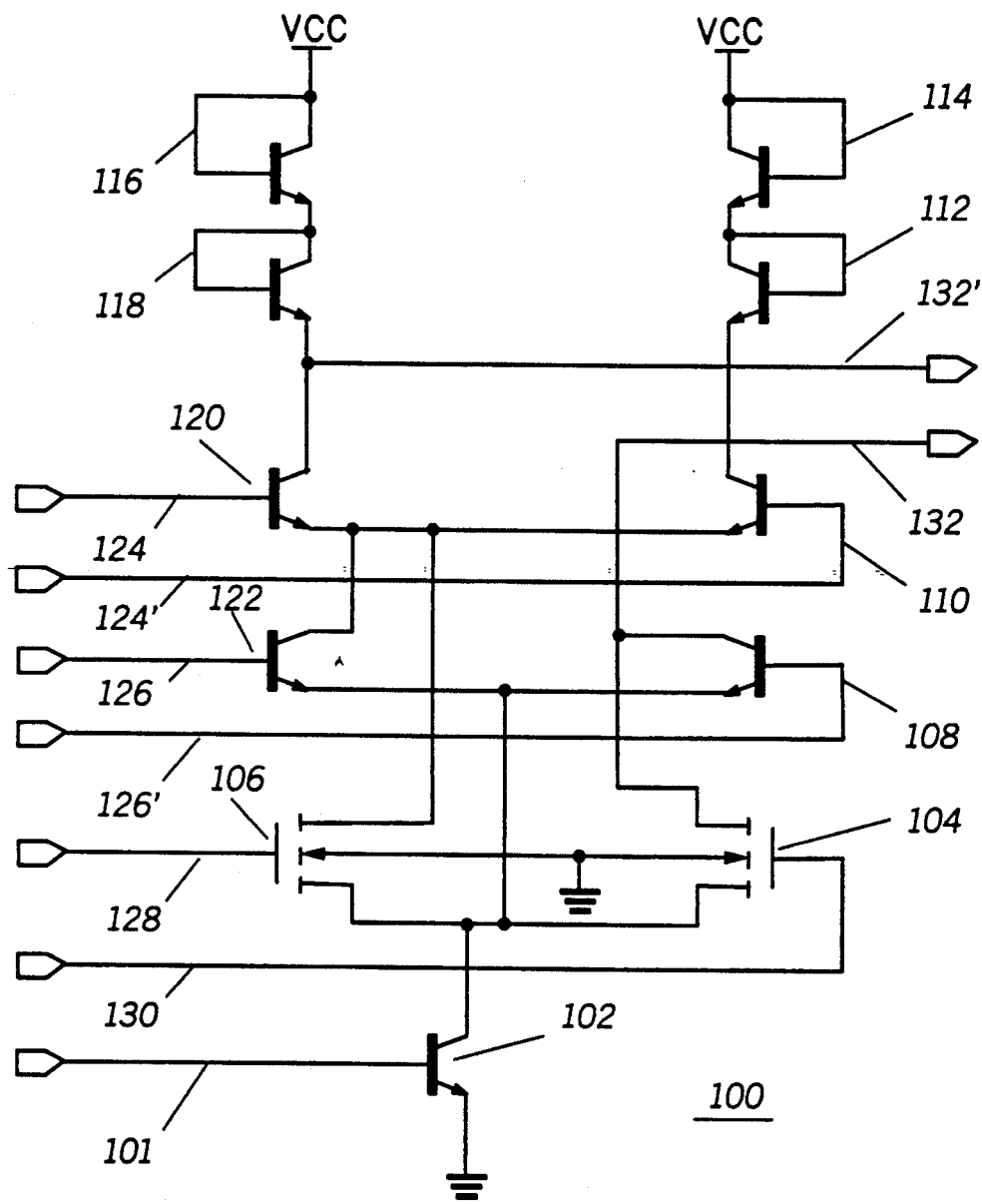
FIG. 3 is a schematic diagram of another BIMOS logic and/or gate in accordance with the present invention.

Referring to FIG. 3, there is shown a schematic diagram of a BIMOS logic circuit 100 in accordance with the present invention. Operationally and physically, BIMOS logic circuit 100 is substantially similar to BIMOS logic circuit 50 of FIG. 2, being biased by a current (101) through transistor 102. Physically, BIMOS logic circuit 100 differs by replacing P-channel MOS transistor 54 of BIMOS logic circuit 50 with a pair of N-channel MOS transistors (104 and 106) having inputs 128 and 130 respectively.

Assuming that the MOS transistor 104 is receiving a logic one-level signal (i.e., approximately 5 volts) the MOS transistor 104 will enter a conductive state that draws current from a voltage source (Vcc) through two diodes 112 and 114. With current flowing through the MOS transistor 104, the potential at a first output port 132 will form a logic zero diode loaded ECL compatible signal. That is, once the MOS transistor 104 receives a logic one-level MOS input signal, a logic zero-level ECL compatible differential output signal of approximately 200 mv is provided at the output port 132. If MOS transistor 104 receives a MOS zero-level signal at input 130, output port 132 is essentially controlled by input 124'. As long as bipolar transistor 110 receives a low ECL level logic signal through input port 124', output port 132 remains high without depending on the conducting state (126') of bipolar transistor 108.

Output port 132' remains high unless bipolar transistor 120 receives an ECL level-one signal (through input port 124) and either bipolar transistor 122 (through input port 126) or MOS transistor 106 (through input port 128) receives an compatible level-one signal, in which case current would flow through diode loads 116 and 118, causing output port 132' to provide an ECL zero-level signal.

ECL compatible differential signals are readily provided by the BIMOS logic circuit 100 through output ports 132 and 132' by providing ECL zero-level logic (approx 0.5 volts) or logic one-level signals (approximately 4.5 volts) to bipolar transistors 108, 110, 120 and 122 at inputs 124 124', 126 and 126' respectively.

The following is a truth table for BIMOS AND/OR logic circuit 100:

| | | | 124 AND 126 = 132 124' OR 126' = 132' | | | | |
|---|---|---|---|---|---|---|---|
| A (124) | AX (124') | B (126) | BX (126') | MCX (130) | LMS (128) | OUT (132) | OUTX (132') |
| X | X | 0 | 1 | 0 | 0 | 0 | 1 |
| 0 | 1 | X | X | 0 | 0 | 0 | 1 |
| 1 | 0 | 1 | 0 | 0 | 0 | 1 | 0 |
| 1 | 0 | X | X | 0 | 1 | 1 | 0 |
| 0 | 1 | X | X | 0 | 1 | 0 | 1 |

-continued

| | | | | 124 AND 126 = 132 124' OR 126' = 132' | | | |
|---|---|---|---|---|---|---|---|
| A (124) | AX (124') | B (126) | BX (126') | MCX (130) | LMS (128) | OUT (132) | OUTX (132') |
| X | X | X | X | 1 | X | 0 | 1 |

Figure 4:
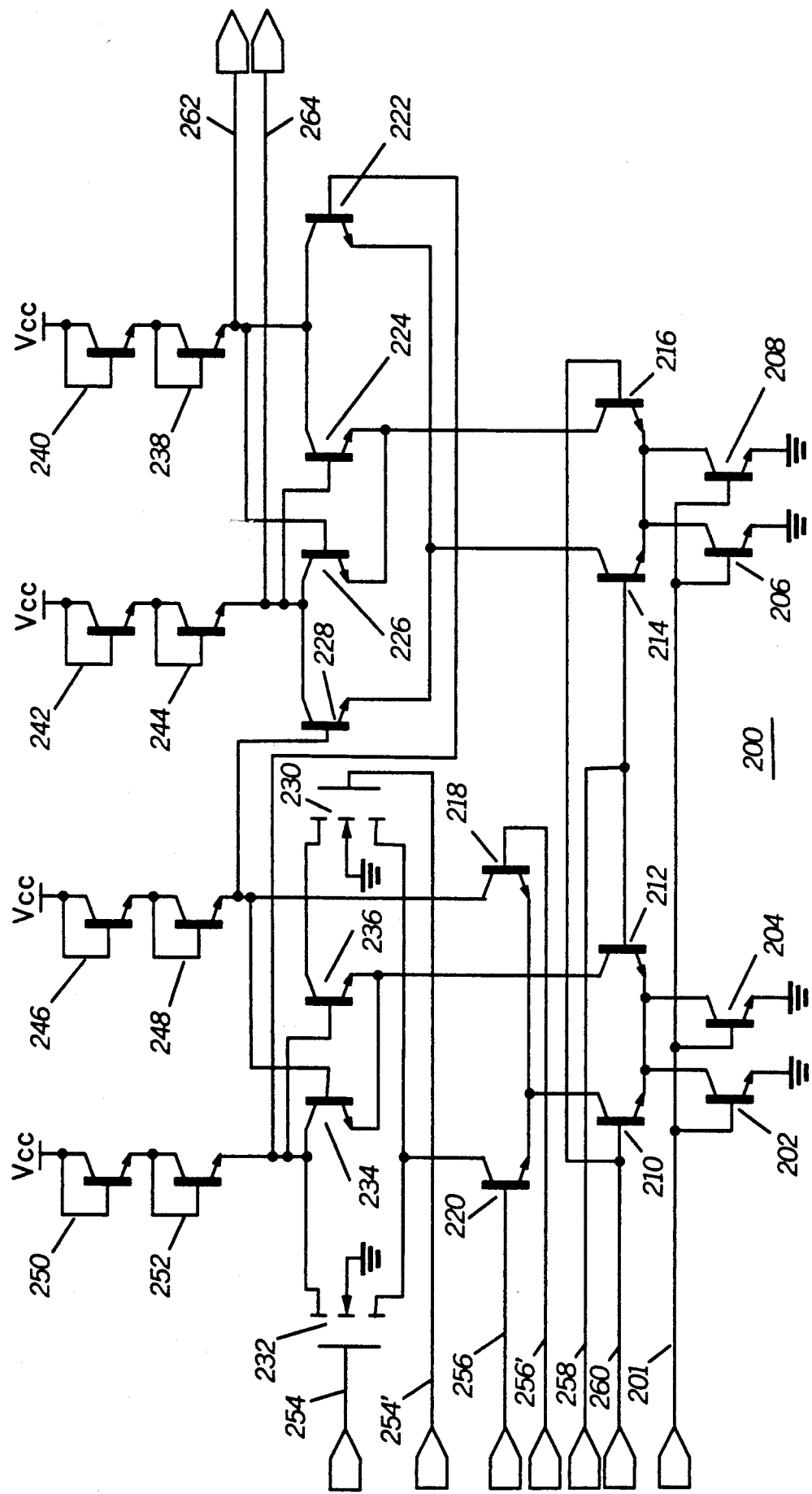
FIG. 4 is a schematic diagram of a BIMOS logic D Flip-Flop in accordance with the present invention.

Referring to FIg. 4 there is shown a schematic diagram of a BIMOS logic circuit (D Flip Flop) 200 in accordance with the present invention. Operationally, a bias current (201) is received by biasing transistors 202, 204, 206, and 208. MOS transistors 232 and 230 are biased by complementary MOS-level signals at inputs 254 and 254'. MOS transistors 230 and 232 convert CMOS level signals to ECL level signals to control the D input of an ECL level flip flop. Bipolar transistor 218 and 220 are biased by complementary ECL-level signals at inputs 256 and 256'. Input ports 254, 254', 256, and 256' receive complementary serial data register signals. BIMOS logic gate 200 has diode load pairs 250 and 252, 246 and 248, 242 and 244, and 238 and 240, each pair being coupled to Vcc.

BIMOS logic gate 200 has six bipolar transistor pairs, each transistor of each transistor pair having an emitter, base and collector, and each transistor pair having coupled emitters. Transistor pair 234 and 236 has transistor 234 biased by current flowing from diode load 246 and 248 and has its collector coupled to diode load 250 and 252. The other transistor 236 is biased by current flowing from diode load 250 and 252 and has its collector coupled to diode load 246 and 248. Transistor pair 228 and 222 has transistor 228 biased by current flowing from diode load 246 and 248 and has its collector coupled to diode load 242 and 244. The other transistor 222 is biased by current flowing from diode load 250 and 252 and has its collector coupled to diode load 238 and 240. Transistor pair 226 and 224 has transistor 226 biased by current flowing from diode load 238 and 240 and has its collector coupled to diode load 242 and 244. Transistor 244 is biased by current flowing from diode 242 and 244, and has its collector coupled to diode load 238 and 240. Transistor pair 220 and 218 has transistor 220 biased by an ECL level input and has its collector coupled to diode load 250 and 252. Transistor 218 is biased by an ECL level complementary input and having its collector coupled to diode load 246 and 248. Transistor pair 210 and 216 has each transistor biased by clock input 260. Transistor 210 has its collector coupled to the emitters of transistor pair 218 and 220 and transistor 216 has its collector coupled to the emitters of transistor pair 224 and 226. Transistors 212 and 214 are biased by said clock input 258. Transistor 212 has its collector coupled to the emitters of transistor pair 234 and 236 and transistor 214 has its collector coupled to the emitters of transistor pair 228 and 222. The gates of said MOS transistors 232 and 230 receive complementary MOS level data register inputs, while the collectors of transistor pair 224 and 226 provide complementary ECL level outputs at ports 262 and 264 respectively.

Operationally, complementary CMOS logic signals 254 and 254' combine with ECL logic signals 256 and 256' forming a merged NAND gate function. The NAND gate consists of devices 220 and 218 and 230 and 232. The outputs of the NAND gate, the drains of MOS transistors 230 and 232, set the master cell of the flip flop transistors 234 and 236. The slave cell consists of bipolar transistor 228 and 222 and 226 and 224. Bipolar transistors 228 and 222 transfer data from the master cell to the slave cell bipolar transistor 226 and 224.

The operating cycle of the this circuit begins with complementary clock inputs 258 receiving a logic zero-level signal and and 260 receiving a logic one-level signal, causing current to flow through bipolar transistor 210 and 216. Data present on inputs 254 and 254' and 256 and 256' causes either load 250-252 or 246-248 to conduct. No data is transferred to output ports 262 and 264.

When the complementary clock inputs change to a logic one-level at port 258 and a logic zero-level at port 260, current flows through bipolar transistors 212 and 214. The data on input ports 254 and 254' and 256 and 256' sets master cell bipolar transistors 234 and 236 upon the rising edge of the clock (258). After the rising edge of the clock (258), the master cell (234 and 236) remains in an unchanged state since current predominantly flows through bipolar transistor 212 rather than bipolar transistor 210. Changing data inputs 254 and 254' and 256 and 256' no longer affect the circuit.

Simultaneously, the master cell (234 and 236) is set and bipolar transistors 228 and 222 are supplied with current by bipolar transistor 214. The cycle completes as the clock (258) falls to a logic zero-level and the complementary clock (260) rises to a logic one-level. During the fall time of 258, bipolar transistor 214 turns off and bipolar transistor 216 turns on. This transistion sets the slave cell (226 and 224) via bipolar transistors 222 and 228. Now the slave cell (226 and 224) is isolated from the input data transitions and the output data remains constant until the next rising clock transition.

What is claimed is:

1. A BIMOS logic gate for receiving external ECL level input signals and external MOS level input signals and for providing ECL level output signals, comprising:

bias means for providing a bias current;

first and second loads coupled to a voltage source;

a MOS transistor, disposed between said bias means and said first load;

first and second bipolar transistors, each transistor having first, second, and third ports, said first bipolar transistor arranged such that its first port is coupled to said first load, its second port is coupled to a complementary ECL level input, and its third port is coupled to said bias means, said second bipolar transistor being arranged such that its first port is coupled to said second load, its second port is coupled to an ECL level input, and its third port is coupled to said bias means;

whereby, said MOS transistor receives only a single external MOS input signal, and the second ports of said first and second bipolar transistors receive input signals, said first ports of said bipolar transistors provide complementary output signals.

2. The BIMOS logic gate of claim 1, wherein said MOS transistor comprises a P-channel MOS transistor.

3. The BIMOS logic gate of claim 1, wherein said first, and second loads comprise diode loads.

4. The BIMOS logic gate of claim 3, wherein said diode loads comprise two series diodes.

5. The BIMOS logic gate of claim 1, wherein said bias means comprises an NPN bipolar transistor.

6. A BIMOS logic gate for receiving external ECL level input signals and external MOS level input signals and for providing ECL level output signal, comprising:

bias means for providing a bias current;

a differential circuit having a first portion comprising a MOS transistor for receiving a single ended external input signal, a first load coupled to a voltage source, and an bipolar transistor biased by a complementary ECL level input disposed between said first load and said bias means;

a second portion of said differential circuit comprising of a bipolar transistor biased by an ECL level input disposed between a second load and said bias means, said second load being coupled to said voltage source;

whereby the junctions between said loads and bipolar transistors in each said first and said second portions are arranged so as to provide complementary outputs.

7. The BIMOS logic gate of claim 6, wherein said MOS transistor comprises a P-channel MOS transistor.

8. The BIMOS logic gate of claim 6, wherein said first and second loads comprise diode loads.

9. The BIMOS logic gate of claim 8, wherein said diode loads comprise two series diodes.

10. The BIMOS logic gate of claim 6, wherein said bias means comprises an NPN bipolar transistor.

11. A BIMOS logic gate for receiving external ECL level input signals and external MOS level input signals and for providing ECL level output signals, comprising:

bias means for providing a bias current;

a first and a second diode load, each coupled to a voltage source;

an MOS transistor disposed between said bias means and said first diode load for receiving only a single ended external MOS input signal;

a first bipolar transistor, having a collector, base, and emitter, arranged such that said collector is coupled to said first diode load, said base being coupled to an complementary ECL level input, and said emitter is coupled to said bias means;

a second bipolar transistor, having a collector, base, and emitter, arranged such that said collector is coupled to said second diode load, said base being coupled to an ECL level input, and said emitter is coupled to said bias means;

the junctions between each said loads and said bipolar transistors providing complementary outputs.

12. A method for interfacing a MOS level signal with complementary ECL level signals, comprising the steps of:

(a) receiving the MOS level signals and the complementary ECL level signals simultaneously;

(b) combining said MOS level signals and ECL level input signals to provide an ECL level output signal; and (c) biasing bipolar transistors with said ECL level input signals to provide complementary ECL level output signals.

13. A BIMOS logic gate, comprising:
bias means for providing a bias current;
first and second loads, coupled to a voltage source;
a MOS transistor, disposed between said bias means and said first load;
first, second, third, and fourth bipolar transistor, each transistor having first, second, and third ports, said first bipolar transistor arranged so its first port is coupled to said first load, said second port is coupled to a primary complementary ECL level input, and said third port is coupled to the third port of said second bipolar transistor, said second bipolar transistor arranged so its first port is coupled to said second load, its second point is coupled to an primary ECL level input, and its third port coupled to said first port of said fourth bipolar transistor, said third bipolar transistor arranged so its first port is coupled to said first load, its second port is coupled to a secondary complementary ECL level input, and its third port is coupled to said third port of said fourth bipolar transistor, said fourth bipolar transistor arranged so its second port is coupled to a secondary ECL level input, and its third port is coupled to said bias means;

whereby, said MOS transistor, and second ports of said first, second, third and fourth bipolar transistors receive input signals, and said first ports of said first and second bipolar transistors provide complementary output signals.

14. The BIMOS logic gate of claim 13, wherein said MOS transistor comprises a P-channel MOS transistor.

15. The BIMOS logic gate of claim 13, wherein said first, and second loads comprise diode loads.

16. The BIMOS logic gate of claim 15, wherein said diode loads comprise two series diodes.

17. The BIMOS logic gate of claim 13, wherein said bias means comprise an NPN bipolar transistor.

18. A BIMOS logic gate for receiving exernal ECL level input signals and external MOS level input signals and for providing ECL level output signals, comprising:

bias means for defining a bias current;

a differential circuit having a first portion comprising a MOS transistor for receiving a single external input signal, a first load coupled to a voltage source, and a first pair of bipolar transistors biased by complementary ECL level inputs disposed between said first load and said bias means;

a second portion of said differential circuit comprising a second pair of bipolar transistors biased by ECL level inputs disposed between a second load and said bias means, said second load being coupled to said voltage source;

whereby the junctions between said loads and bipolar transistors in each said first and said second portions provide complementary outputs.

19. The BIMOS logic gate of claim 18, wherein said MOS transistor comprises a P-channel MOS transistor.

20. The BIMOS logic gate of claim 18, wherein said first and second loads comprise diode loads.

21. The BIMOS logic gate of claim 20, wherein said diode loads comprise two series diodes.

22. The BIMOS logic gate of claim 18, wherein said bias means comprises an NPN bipolar transistor.

23. A BIMOS logic gate, comprising:
bias means for providing a bias current;
first and second diode loads, coupled to a voltage source;
a first and second MOS transistor, said first MOS transistor diposed between said bias means and said first load, said second MOS transistor disposed between said bias means and said second load;
a first, second, third, and fourth bipolar transistor, each transistor having first, second, and third ports, said first bipolar transistor arranged so its first port is coupled to said first load, its second port is coupled to a primary complementary ECL level input, and its third port is coupled to the third port of said second bipolar transistor, said second bipolar transistor arranged so its first port is coupled to said second load, its second port is coupled to a primary ECL level input, and its third port coupled to said first port of said fourth bipolar transistor and said second MOS transistor, said third bipolar transistor arranged so it first port is coupled to said first load, its second port is coupled to a secondary complementary ECL level input, and its third port is coupled to said third port of said fourth bipolar transistor, said fourth bipolar transistor arranged so its second port is coupled to a secondary ECL level input, and its third port is coupled to said bias means;

whereby, said first and second MOS transistor, and second ports of said first, second, third and fourth bipolar transistors receive input signals, and said first ports of said first and second bipolar transistors provide complementary output signals.

24. The BIMOS logic gate of claim 23, wherein said MOS transistors comprise N-channel MOS transistors.

25. The BIMOS logic gate of claim 23, wherein said first, and second loads comprise diode loads.

26. The BIMOS logic gate of claim 25, wherein said diode loads comprise two series diodes.

27. The BIMOS logic gate of claim 23, wherein said bias means comprises an NPN bipolar transistor.

28. A BIMOS logic gate for receiving external ECL level input signals and external MOS level input signals and for providing ECL level output signals, comprising:
bias means for providing a bias current;
a differential circuit having a first portion comprising a first MOS transistor for receiving a single external input signal, a first load coupled to a voltage source, and a first pair of bipolar transistors biased by complementary ECL level inputs disposed between said first load and said bias means;
a second portion of said differential circuit comprising of a second MOS transistor for receiving another single external input signal, a second pair of bipolar transistor biased by ECL level inputs disposed between a second load and said bias means, said second load being coupled to said voltage source;
whereby the junctions between said loads and bipolar transistors in each of said first and said second portions provide complementary outputs.

29. The BIMOS logic gate of claim 28, wherein said MOS transistors comprise N-channel MOS transistors.

30. The BIMOS logic gate of claim 28, wherein said first and second loads comprise diode loads.

31. The BIMOS logic gate of claim 30, wherein said diode loads comprise two series diodes.

32. The BIMOS logic gate of claim 28, wherein said bias means comprises an NPN bipolar transistor.

33. A BIMOS logic gate for receiving external ECL level input signals and MOS level input signals and for providing ECL level output signals, comprising:
a first and second diode load, each coupled to a voltage supply;
bias means for providing a bias current;
a first and second transistor, each having an emitter coupled to said bias means, each having a collector coupled to said first and second diode loads respectively at respective first and second nodes, said nodes providing ECL level output signals, and each having a base coupled to complementary input; and
a MOS transistor having one end coupled to said first node, another end coupled to said bias means, and providing a single ended external input terminal at it gate.

34. The BIMOS logic gate of claim 33, wherein said MOS transistor comprises a P-channel MOS transistor.

35. The BIMOS logic gate of claim 33, wherein said first, and second loads comprise diode loads.

36. The BIMOS logic gate of claim 35, wherein said diode loads comprise two series diodes.

37. The BIMOS logic gate of claim 33, wherein said bias means comprises an NPN bipolar transistor.

38. A BIMOS logic gate, comprising:
first, second, third, and fourth diode loads coupled to a voltage supply;
bias means providing a bias current;
first and second pairs of data register complementary inputs;
first and second clock inputs;
first and second MOS transistors, said first MOS transistor being disposed between said first load and said bias means, said second MOS transistor being disposed between said second load and said bias means;
first, second, third, fourth, fifth, and sixth transistor pairs, each transistor of each transistor pair having an emitter, base and collector, and each transistor pair having coupled emitters, said first transistor pair having one transistor biased by current flowing from said second diode load and having a collector coupled to said first diode load the other transistor being biased by current flowing from said first diode load and having its collector coupled to said second diode load, said second transistor pair having one transistor biased by current flowing from said second diode load and having its collector coupled to said third diode load, the other transistor being biased by current flowing from said first diode load and having its collector coupled to said fourth diode load, said third transistor pair having one transistor biased by current flowing from said fourth diode load and having a collector coupled to said third diode load and another transistor biased by current flowing from said third diode load and having a collector coupled to said fourth diode load, said fourth transistor pair having one transistor biased by a CMOS level input and having its collector coupled to said first load, the other transistor being biased by a CMOS level complementary input and having its collector coupled to said second load, said fifth transistor pair having one transistor biased by said first clock input and having its collector coupled to said emitters of said fourth transistor pair, the other transistor being biased by said second clock input and having its collector coupled to said second clock input and having its collector coupled to said emitters of said first transistor pair, said sixth transistor pair having one transistor biased by said second clock input and having its collector coupled to said emitter of said second transistor pair, the other transistor being biased by said first clock input and having its collector coupled to said emitter of said third transistor pair,
whereby the gates of said first and second MOS transistors and said bases of said fourth transistor pair receive complementary MOS level data register inputs, and said collectors of said third transistor pair provide complementary ECL level outputs.

39. The BIMOS logic gate of claim 38, wherein said MOS transistors comprise N-channel MOS transistors.

40. The BIMOS logic gate of claim 38, wherein said first and second loads comprise diode loads.

41. The BIMOS logic gate of claim 40, wherein said diode loads comprises two series diodes.

42. The BIMOS logic gate of claim 38, wherein said bias means comprises an NPN bipolar transistor.

* * * * *